United States Patent
Kawada

(10) Patent No.: US 9,502,250 B2
(45) Date of Patent: Nov. 22, 2016

(54) MANUFACTURING METHOD OF SILICON CARBIDE SEMICONDUCTOR APPARATUS

(71) Applicant: FUJI ELECTRIC CO., LTD., Kawasaki-shi, Kanagawa (JP)

(72) Inventor: Yasuyuki Kawada, Tsukuba (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/018,214

(22) Filed: Feb. 8, 2016

(65) Prior Publication Data
US 2016/0233087 A1    Aug. 11, 2016

(30) Foreign Application Priority Data
Feb. 10, 2015   (JP) .................. 2015-024582

(51) Int. Cl.
| | |
|---|---|
| *H01L 29/78* | (2006.01) |
| *H01L 21/04* | (2006.01) |
| *H01L 29/45* | (2006.01) |
| *H01L 29/417* | (2006.01) |
| *H01L 21/285* | (2006.01) |

(52) U.S. Cl.
CPC ..... *H01L 21/0485* (2013.01); *H01L 21/28518* (2013.01); *H01L 29/417* (2013.01); *H01L 29/45* (2013.01)

(58) Field of Classification Search
CPC .......... H01L 21/0485; H01L 29/1608; H01L 2924/0002; H01L 2924/00; H01L 29/45; H01L 29/47; H01L 29/6606; H01L 29/872; H01L 21/049; H01L 21/28008; H01L 21/28273; H01L 21/32155; H01L 29/4933
USPC ........... 257/77, E21.062, E29.143, E21.054, 257/E21.159, E23.01, E29.068, 198, 743, 257/744, 750, 757, 763, 764, 766, 770; 438/597, 602, 285, 586, 655, 660, 682
See application file for complete search history.

(56) References Cited

U.S. PATENT DOCUMENTS

| | | | |
|---|---|---|---|
| 8,624,275 B2* | 1/2014 | Matsushima | H01L 27/3223 257/40 |
| 8,698,124 B2* | 4/2014 | Shibata | H01L 33/145 257/13 |
| 8,729,580 B2* | 5/2014 | Lester | H01L 33/44 257/100 |

(Continued)

FOREIGN PATENT DOCUMENTS

| | | |
|---|---|---|
| JP | 2004-335899 A | 11/2004 |
| JP | 5565895 B2 | 8/2014 |

*Primary Examiner* — William F Kraig
*Assistant Examiner* — Edward Chin
(74) *Attorney, Agent, or Firm* — Rabin & Berdo, P.C.

(57) ABSTRACT

In a surface of a SiC semiconductor portion, a surface electrode film including a first electrode film composed of nickel and a second electrode film composed of nickel, silicon, and tantalum, are sequentially stacked. The first electrode film has a thickness of 3 nm or more and 10 nm or less. Composition of the second electrode film is within a range from 60Ni 30Si 10Ta to 53Ni 27Si 20Ta, expressed in at %. Next, by heat treatment, the SiC semiconductor portion and the first electrode film are reacted to generate a nickel silicide film, and an ohmic contact is formed. At this time, excess carbon atoms that have separated from the SiC semiconductor portion bond to tantalum atoms in the second electrode film and are silicided, making deposition thereof in the surface of the surface electrode film difficult. Thereafter, a wiring film is formed in the surface of the surface electrode film.

7 Claims, 4 Drawing Sheets

(56) References Cited

U.S. PATENT DOCUMENTS

| | | | |
|---|---|---|---|
| 2004/0183436 A1* | 9/2004 | Ito | H01L 27/3246 313/506 |
| 2011/0017991 A1 | 1/2011 | Tanimoto et al. | |
| 2012/0138973 A1* | 6/2012 | Matsushima | H01L 27/3211 257/88 |
| 2013/0126839 A1* | 5/2013 | Matsushima | H01L 27/3246 257/40 |
| 2014/0070187 A1* | 3/2014 | Cho | H01L 51/52 257/40 |
| 2014/0183499 A1* | 7/2014 | Kim | H01L 27/3213 257/40 |
| 2014/0225087 A1* | 8/2014 | Fang | H01L 27/288 257/40 |
| 2015/0048316 A1* | 2/2015 | Choi | H01L 51/5284 257/40 |

* cited by examiner

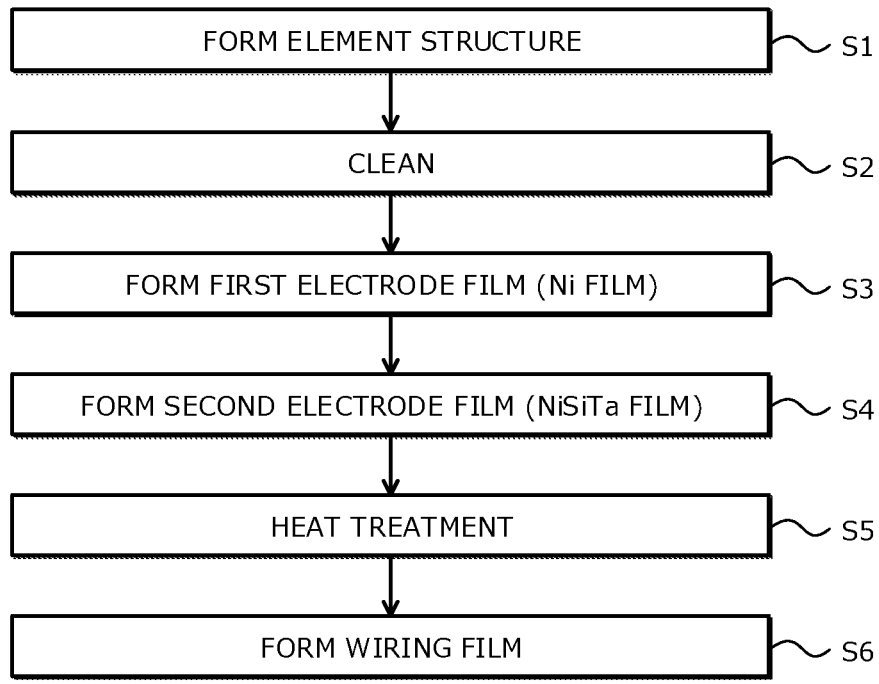
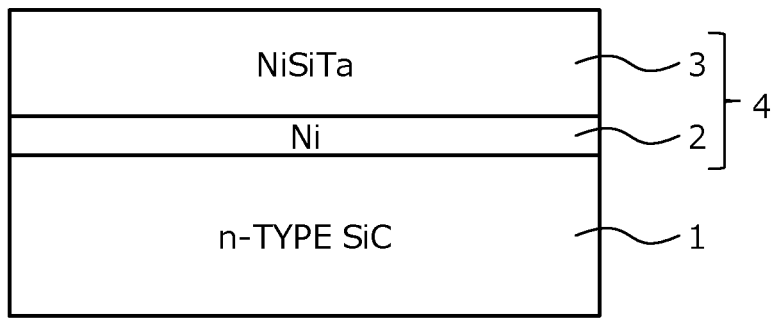

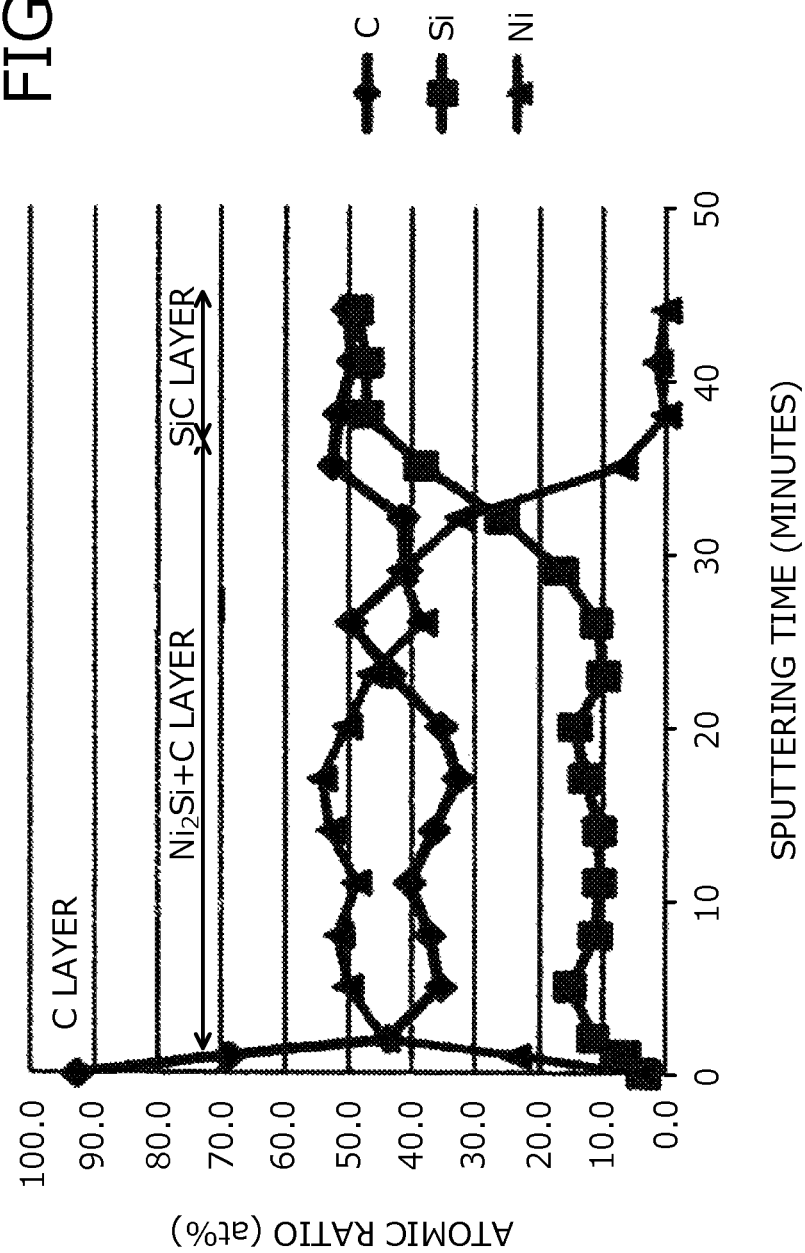

FIG.4

| Ni FILM THICKNESS | Si COMPOSITION | Ni COMPOSITION | C COMPOSITION |
|---|---|---|---|
| 3 nm | 30 | 62 | 8 |
| 10 nm | 32 | 62 | 6 |
| 15 nm | 28 | 56 | 16 |
| 20 nm | 25 | 53 | 22 |

FIG.5

| NiSiTa FILM COMPOSITION | Si COMPOSITION | Ni COMPOSITION | C COMPOSITION |
|---|---|---|---|
| 64Ni32Si4Ta | 26 | 54 | 20 |
| 62Ni31Si7Ta | 27 | 58 | 15 |
| 60Ni30Si10Ta | 32 | 62 | 6 |
| 53Ni27Si20Ta | 28 | 65 | 7 |
| 51Ni26Si23Ta | 31 | 62 | 7 |

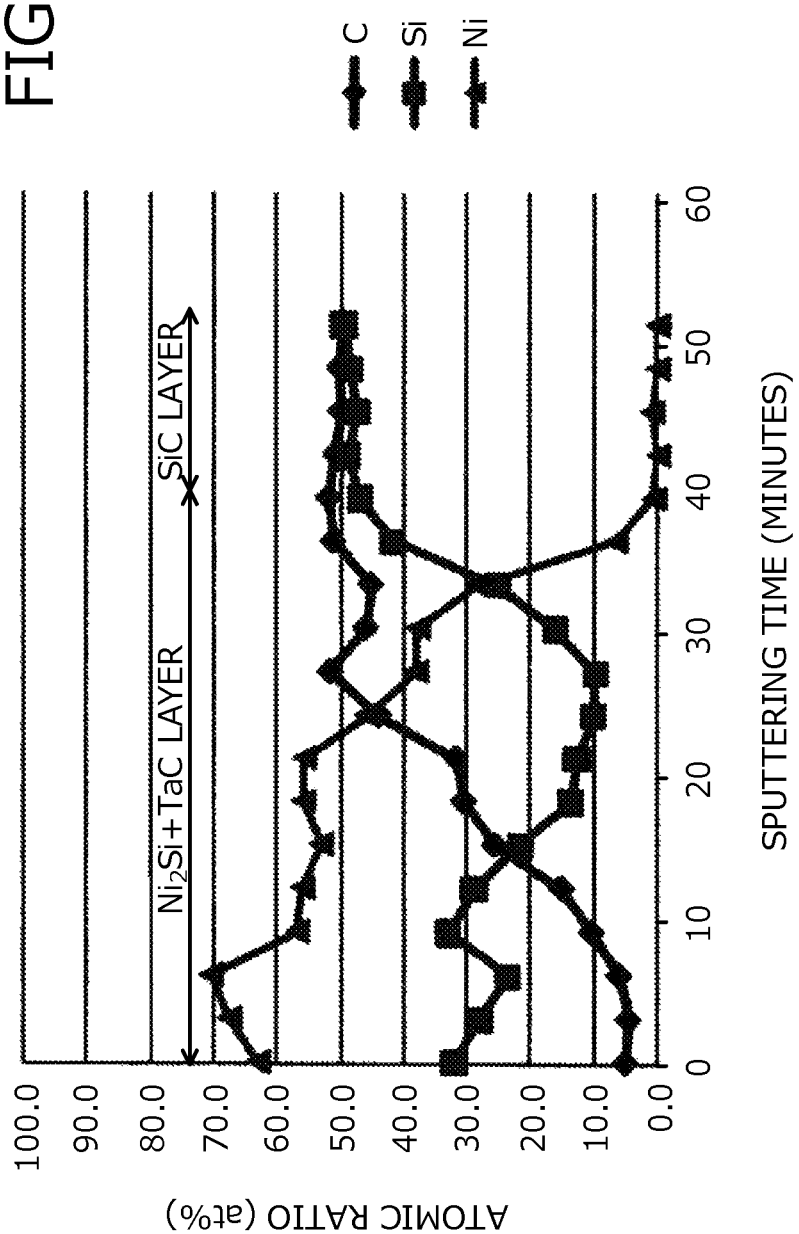

MANUFACTURING METHOD OF SILICON CARBIDE SEMICONDUCTOR APPARATUS

CROSS REFERENCE TO RELATED APPLICATIONS

This application is based upon and claims the benefit of priority of the prior Japanese Patent Application No. 2015-024582, filed on Feb. 10, 2015, the entire contents of which are incorporated herein by reference.

BACKGROUND OF THE INVENTION

1. Field of the Invention

The embodiments discussed herein are related to a manufacturing method of a silicon carbide semiconductor apparatus.

2. Description of the Related Art

Conventionally, silicon carbide (SiC) semiconductors are stable thermally, chemically, and mechanically, and application thereof as light emitting elements and high frequency devices, power semiconductor apparatuses (power device), etc. is expected in various industrial fields. In particular, high breakdown voltage metal oxide semiconductor field effect transistors (MOSFET) using a SiC semiconductor have an advantage of having an ON resistance that is lower than power devices that use a silicon (Si) semiconductor. Further, a Schottky diode that uses a SiC semiconductor has been reported to have a lower forward voltage drop than a Schottky diode that uses a silicon semiconductor.

Although the ON resistance and switching speed of a power device have a trade-off relationship, power devices using a SiC semiconductor have the potential of concurrently achieving low ON resistance and high switching speed. In lowering the ON resistance of a power device that uses a SiC semiconductor, reduction of the contact resistance of an ohmic contact (electrical contact unit) formed between an electrode film and a SiC semiconductor portion is important. Further, to increase the switching speed of the power device, the contact resistance of the ohmic contact with respect to the SiC semiconductor portion is a significant problem. Concerning this point, one problem in practical application of a power device that uses a SiC semiconductor is that a technique for forming an ohmic contact of a low resistance suitable for practical use and adaptable for production (manufacturing) processes and structures of devices has not been sufficiently established.

For example, a method of depositing an electrode film on the n-type SiC semiconductor portion and subjecting a formed ohmic electrode structure to heat treatment at a high temperature on the order of 800 to 1200 degrees C. has been proposed and is a conventional technique widely used to form a low resistance ohmic contact of the n-type SiC semiconductor portion (for example, refer to Japanese Patent Application Laid-Open Publication No. 2004-335899 (paragraphs 0038 to 0039)). Nickel (Ni), tungsten (W), and titanium (Ti) are commonly known electrode materials (for example, refer to Japanese Patent Application Laid-Open Publication No. 2004-335899 (paragraph 0053) and Japanese Patent No. 5565895 (paragraphs 0011 to 0013)). In particular, an ohmic contact using nickel as an electrode material obtains a contact resistance value on the order of $10^{-6}$ $\Omega cm^2$, which is suitable for practical use and very promising as ohmic contact.

When nickel is used as an electrode material, the nickel film and SiC semiconductor portion react consequent to the high-temperature heat treatment and a reaction layer (e.g., nickel silicide (NiSi) film) of a mixed conductivity of nickel-silicon-carbon (C) is formed as an electrode film. In this case, consequent to the generation of the reaction layer, a significant amount of carbon atoms separated (diffused) from the SiC semiconductor portion are deposited near the surface of the electrode film, and electrode film surface is substantially covered by a carbon layer formed by the deposition of the separated carbon atoms. Therefore, because of the carbon layer deposited on the electrode film surface, adhesion of the electrode film and a wiring film of aluminum (Al), etc. further stacked (formed) on the electrode film for wiring becomes poor, and may cause peeling of the wiring film. To suppress the peeling of the wiring film, after the wiring film is deposited by a relatively high temperature, the carbon layer deposited on the surface of the wiring film has to be physically and/or chemically removed.

As described, when nickel is used as an electrode material, carbon atoms separated from the SiC semiconductor portion are deposited in the surface of the electrode film (nickel silicide film) that is formed by high temperature heat treatment and a problem arises in that these deposited carbon atoms cause the wiring film such as an aluminum film, etc. formed on the electrode film to be susceptible to peeling.

SUMMARY OF THE INVENTION

To solve the problems above and achieve an object, a manufacturing method of a silicon carbide semiconductor apparatus according to the present disclosure is a manufacturing method of a silicon carbide semiconductor apparatus and of forming an ohmic contact of a silicon carbide semiconductor portion and a surface electrode film formed in a surface of the silicon carbide semiconductor portion. The manufacturing method includes forming in the surface of the silicon carbide semiconductor portion, a first electrode film of nickel as the surface electrode film; forming in a surface of the first electrode film, a second electrode film of nickel, silicon, and tantalum as the surface electrode film; and forming an ohmic contact of the silicon carbide semiconductor portion and the surface electrode film by reacting silicon atoms of the silicon carbide semiconductor portion and nickel atoms of the first electrode film and silicidating the first electrode film by heat treatment.

In the manufacturing method of a silicon carbide semiconductor apparatus according to the present invention above, the forming of the second electrode film includes forming the second electrode film to include tantalum atoms of an atom count that is close to an atom count of carbon atoms that separate from the silicon carbide semiconductor portion during the forming of the ohmic contact.

In the manufacturing method of a silicon carbide semiconductor apparatus according to the present invention above, the forming of the second electrode film includes forming the second electrode film to include tantalum atoms at an inclusion rate of 10 at % or more and 20 at % or less.

In the manufacturing method of a silicon carbide semiconductor apparatus according to the present invention above, the forming of the second electrode film includes forming the second electrode film to include nickel atoms and silicon atoms of a compositional ratio that is close to a compositional ratio of nickel silicide generated by a reaction of the silicon carbide semiconductor portion and the nickel.

In the manufacturing method of a silicon carbide semiconductor apparatus according to the present invention above, the forming of the second electrode film includes forming the second electrode to include nickel atoms at an inclusion rate that is twice the silicon atoms.

In the manufacturing method of a silicon carbide semiconductor apparatus according to the present invention above, the forming of the second electrode film includes forming the second electrode film to have a composition within a range from an inclusion rate of 60 at % nickel atoms, 30 at % silicon atoms, and 10 at % tantalum atoms to an inclusion rate of 53 at % nickel atoms, 27 at % silicon atoms, and 20 at % tantalum atoms.

In the manufacturing method of a silicon carbide semiconductor apparatus according to the present invention above, the forming of the first electrode film includes forming the first electrode film to have a thickness of 3 nm or more and 10 nm or less.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 1 is a flowchart of an outline of a manufacturing method of a silicon carbide semiconductor apparatus according to an embodiment;

FIG. 2 is a cross sectional view of a silicon carbide semiconductor apparatus during manufacture according to the embodiment;

FIG. 3 is a diagram depicting element distribution in a depth direction of a surface electrode film in a first conventional example;

FIG. 4 is a diagram depicting the relationship between thickness of a first electrode film and composition near the surface of the surface electrode film after heat treatment in a first example;

FIG. 5 is a diagram depicting the relationship between composition of a second electrode film and the composition near the surface of the surface electrode film after heat treatment in a second example; and FIG. 6 is a diagram depicting element distribution in a depth direction of the surface electrode film in the second example.

DETAILED DESCRIPTION OF THE PREFERRED EMBODIMENTS

Preferred embodiments of a manufacturing method of a silicon carbide semiconductor apparatus according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, identical constituent elements will be given the same reference numerals and will not repeatedly be described.

Embodiment

Concerning a manufacturing method of a silicon carbide semiconductor apparatus according to an embodiment, a method of forming an ohmic contact of a surface electrode film and a semiconductor portion (SiC semiconductor portion) formed by a silicon carbide (SiC) semiconductor will be described. FIG. 1 is a flowchart of an outline of the manufacturing method of a silicon carbide semiconductor apparatus according to the embodiment. FIG. 2 is a cross sectional view of a silicon carbide semiconductor apparatus during manufacture according to the embodiment. FIG. 2 depicts a state immediately after a surface electrode film 4 is formed by sequentially stacking first and second electrode films 2, 3 on an n-type SiC semiconductor portion 1. The n-type SiC semiconductor portion 1 is, for example, an n-type semiconductor substrate formed of an n-type SiC semiconductor (hereinafter, SiC substrate), an n-type SiC semiconductor layer (epitaxial layer) stacked on a SiC substrate, or an n-type SiC region provided in a surface layer of a SiC substrate. The surface electrode film 4 is a front surface electrode or a back surface electrode of a silicon carbide semiconductor element (silicon carbide semiconductor apparatus) having the n-type SiC semiconductor portion 1 and in the surface thereof, a wiring film is formed.

By a standard method, a given element structure (device structure) is formed (step S1). In other words, at step S1, a silicon carbide semiconductor element (semiconductor chip) having the n-type SiC semiconductor portion 1 is produced. Constituent units of the element structure are semiconductor regions or semiconductor layers formed according to the element structure. An element structure may be configured by constituent units inside or on a surface of the n-type SiC semiconductor portion 1, may be configured to include the n-type SiC semiconductor portion 1 as one constituent unit, etc. More specifically, the constituent units of an element structure, for example, when a MOSFET is produced (manufactured), are a p-type base region or an $n^+$-type source region configuring a MOS gate (insulating gate formed by a metal oxide film semiconductor) structure that is a front surface element structure; an $n^+$-type drain region configuring a back surface element structure; etc. Next, the silicon carbide semiconductor element having the n-type SiC semiconductor portion 1 is cleaned by a standard method (step S2).

As depicted in FIG. 2, on the n-type SiC semiconductor portion 1 (surface), a first electrode film (Ni film) 2 of nickel (Ni) is deposited (formed) (step S3). Thickness of the first electrode film 2 is preferably thin to suppress excess carbon atoms and for example, 3 nm or greater and 10 nm or less is favorable. The reason for this is as follows. If the thickness of the first electrode film 2 is less than 3 nm, during the heat treatment for forming an ohmic contact described hereinafter, the reaction amount of nickel atoms in the first electrode film 2 and silicon atoms in the n-type SiC semiconductor portion 1 is insufficient and the ohmic property (contact resistance value) is negatively affected. Further, if the thickness of the first electrode film 2 exceeds 10 nm, during the heat treatment for forming the ohmic contact, the reaction amount of the nickel atoms in the first electrode film 2 and the silicon atoms in the n-type SiC semiconductor portion 1 is too great. As a result, excess carbon (C) atoms separated (diffused) from the n-type SiC semiconductor portion 1 by the reaction with the first electrode film 2 tend to deposit on the surface of the surface electrode film 4.

Next, for example, a second electrode film (NiSiTa film) 3 including nickel, silicon, and tantalum (Ta) of a given compositional ratio is deposited in a surface of the first electrode film 2 subsequent to the deposition of the first electrode film 2 (step S4). By the processes at steps S3 and S4, on the n-type SiC semiconductor portion 1, the surface electrode film 4 is formed by the first and second electrode films 2, 3 sequentially stacked. The second electrode film 3 preferably includes tantalum atoms of an atom count that is close to the atom count of the excess carbon atoms that separate from the n-type SiC semiconductor portion 1 during the heat treatment for the ohmic contact. More specifically, an inclusion rate of tantalum atoms in the second electrode film 3, for example, is favorably about 10 at % or more and 20 at % or less. The reason for this is as follows. In the heat treatment for forming the ohmic contact, the excess carbon atoms that separate from the n-type SiC semiconductor portion 1 bond with the tantalum atoms in the second electrode film 3 to form a carbide. The carbon atoms forming the carbide are taken into the surface electrode film 4 and become less susceptible to deposition on the surface of the surface electrode film 4. Here, when the inclusion rate of the tantalum atom in the second electrode film 3 is less than 10 at %, the tantalum atoms are insufficient and the excess carbon atoms are deposited on the surface of the surface electrode film 4 without bonding with the tantalum atoms. When the inclusion rate of the tantalum atoms in the second electrode film 3 exceeds 20 at %, the inclusion rate of nickel atoms and silicon atoms (nickel silicide inclusion rate) in the second electrode film 3 becomes relatively low, tantalum atoms do not bond with the excess carbon atoms and tend to remain non-bonded, negatively affecting the ohmic property.

Further, the compositional ratio of nickel atoms and silicon atoms in the second electrode film 3 is preferably close to the compositional ratio of a nickel silicide ($Ni_2Si$) film generated by a reaction of only the n-type SiC semiconductor portion and nickel film. The reason for this is that in the heat treatment for forming the ohmic contact, the reaction of the nickel atoms in the second electrode film 3 and the silicon atoms in the n-type SiC semiconductor portion 1 can be minimized. As a result, separation of excess carbon atoms from the n-type SiC semiconductor portion 1 consequent to the reaction with the second electrode film 3 can be suppressed. Therefore, the second electrode film 3 preferably includes nickel atoms at an inclusion rate that is about twice the inclusion rate of the silicon atoms (Ni:Si=2:1), and the inclusion rate of the tantalum atoms is preferably within the range described above. More specifically, composition of the second electrode film 3, for example, is preferably within a range from 60Ni30Si10Ta to 53Ni27Si20Ta. "○Ni△Si◇Ta" representing composition of the second electrode film 3 represents a content of o at nickel atoms, △ at % silicon atoms, and ◇ at % tantalum atoms.

In depositing the first and second electrode films 2, 3, for example, a direct current (DC) sputtering method may be used. More specifically, for example, a direct current of 300 W is applied to the SiC semiconductor substrate (in the silicon carbide semiconductor element, the entire portion configured by a SiC semiconductor and including the n-type SiC semiconductor portion 1) inserted in a heat treatment furnace of a sputtering apparatus and at a temperature (for example, 25 degrees C.), i.e., without heating the SiC semiconductor substrate, sputtering is performed at a pressure of 1 Pa in an argon (Ar) atmosphere. In depositing the first electrode film 2, for example, a target of 99.99 wt % nickel purity may be used. In depositing the second electrode film 3, for example, a target of including nickel, silicon, and tantalum at compositional ratios within the composition range above for the second electrode film 3 is used.

Next, the n-type SiC semiconductor substrate (entire element) having the first and second electrode films 2, 3 stacked thereon is subject to heat treatment in a high temperature vacuum atmosphere, whereby an ohmic contact of the n-type SiC semiconductor portion 1 and the surface electrode film 4 is formed (step S5). More specifically, for example, in a vacuum atmosphere evacuated to $5 \times 10^{-4}$ Pa or less, high heat treatment is performed at a temperature of about 1000 degrees C. for about 5 minutes and thereafter, cooling to room temperature is performed. By this heat treatment, the nickel atoms in the first electrode film 2 and the silicon atoms in the n-type SiC semiconductor portion 1 react, generating a nickel silicide film. The entire first electrode film 2 may be formed into silicide. Consequent to the first electrode film 2 being formed into silicide, excess carbon atoms separate from the n-type SiC semiconductor portion 1 and are taken into the nickel silicide film generated by the reaction of the first electrode film 2 and the n-type SiC semiconductor portion 1. The excess carbon atoms taken into the nickel silicide film bond with the tantalum atoms in the second electrode film 3 to form carbide, making deposition the excess carbon atoms in the surface of the surface electrode film 4 difficult. In other words, the excess carbon atoms are taken inside the surface electrode film 4. The surface electrode film 4 becomes a metal film that includes nickel silicide and tantalum carbide (TaC), has strong adhesion to the n-type SiC semiconductor portion 1, and low contact resistance.

Next, in a surface of the second electrode film 3, for example, a wiring film (not depicted) of aluminum (Al) is formed (step S6). Thereafter, by a standard process performed after formation of the wiring film, a silicon carbide semiconductor element having the surface electrode film 4 forming an ohmic contact with the n-type SiC semiconductor portion 1 is completed.

As described, according to the embodiment, by sequentially stacking the first electrode film formed of nickel and the second electrode film including nickel, silicon, and tantalum, as a surface electrode film, in the heat treatment thereafter, excess carbon atoms separating from the SiC semiconductor portion by the reaction with the first electrode film can be bonded with the tantalum atoms in the second electrode film. As a result, excess carbon atoms separated from the SiC semiconductor portion can be taken inside the surface electrode film, enabling at the surface of the surface electrode film (the surface of the second electrode film), i.e., deposition of excess carbon atoms at the interface with the wiring film can be suppressed. Therefore, adhesion of the surface electrode film and the wiring film can be increased, making peeling of the wiring film more difficult to occur. Further, since a metal film that includes nickel silicide can be formed as the surface electrode film, strong adhesion to the SiC semiconductor portion and low contact resistance are achieved. Therefore, even when high heat treatment is performed, the deposition of excess carbon atoms at an uppermost surface is suppressed, establishing adhesion to the wiring film and enabling formation of a surface electrode film exhibiting favorable ohmic property.

Further, according to the embodiment, by making the thickness of the first electrode film thin, the atom count of the excess carbon atoms that separate from the SiC semiconductor portion consequent to the reaction with the first electrode film can be reduced. Further, by making the compositional ratio of the silicon atoms and the nickel atoms of the second electrode film a compositional ratio close to the compositional ratio of nickel silicide, the reaction of the nickel atoms in the second electrode film with the silicon atoms in the SiC semiconductor portion can be suppressed since silicon atoms are already present in the second electrode film. As a result, there is substantially no separation of excess carbon atoms from the SiC semiconductor portion outside that from the reaction with the first electrode film. Thus, since the excess carbon atoms separating from the SiC semiconductor portion can be reduced, the inclusion rate of the tantalum atoms in the second electrode film can be lowered. Therefore, the inclusion rate of the nickel atoms and the silicon atoms in the second electrode film can be made relatively high, enabling tantalum atoms that do not bond with the excess carbon atoms and remain non-bonded to be suppressed. Therefore, the ohmic property can be prevented from being negatively affected.

EXAMPLE

The relationship between the thickness of the first electrode film 2 and, the composition of the second electrode film 3 and the composition near the surface (interface with wiring film interface) of the surface electrode film 4 was verified. FIG. 3 is a diagram depicting element distribution in a depth direction of the surface electrode film in a first conventional example. FIG. 4 is a diagram depicting the relationship between the thickness (Ni film thickness) of the first electrode film and the composition near the surface of the surface electrode film after heat treatment in a first example. FIG. 5 is a diagram depicting the relationship between the composition (NiSiTa film composition) of the second electrode film and the composition near the surface of the surface electrode film after heat treatment in a second example. FIG. 6 is a diagram depicting element distribution in a depth direction of the surface electrode film in the second example. Concerning the element distribution of FIGS. 3 and 6 and the surface composition of FIGS. 4 and 5, composition in the depth direction of the surface electrode film 4 were measured by alternately performing detection by X-ray photoelectron spectroscopy (XPS) and sputtering.

First, by a conventional standard manufacturing method of a silicon carbide semiconductor apparatus, a test specimen formed by a surface electrode film forming an ohmic contact with an n-type SiC semiconductor portion was produced (hereinafter, first conventional example). More specifically, in the first conventional example, after a nickel film of a 100 nm thickness was deposited in the surface of the n-type SiC semiconductor portion, a surface electrode film formed by silicidation of the nickel film by heat treatment was formed. In other words, the surface electrode film of the first conventional example is a nickel silicide ($Ni_2Si$) film. The heat treatment conditions of the first conventional example were the same as a first example described hereinafter. By an XPS method, element distribution in a depth direction from the surface (surface of the surface electrode film, on the opposite side of surface electrode film with respect to the n-type SiC semiconductor portion side (hereinafter, uppermost surface)) was measured. The results are depicted in FIG. 3. In FIG. 3, a position where the sputtering time=0 minutes is the uppermost surface of the surface electrode film (similarly in FIG. 6).

From the results depicted in FIG. 3, in the first conventional example, the silicon atoms and the carbon atoms in the n-type SiC semiconductor portion (SiC layer) were confirmed to have diffused into the surface electrode film (portion farther on the left than the SiC layer). Further, it was confirmed that carbon atoms that separated from the n-type SiC semiconductor portion consequent to the reaction with the surface electrode film were taken into the surface electrode film ($Ni_2Si+C$ layer) and a large volume left the surface electrode film, were deposited in the uppermost surface, and formed a carbon layer (C layer). In general, nickel is known to react with silicon to form nickel silicide. Therefore, from the results depicted in FIG. 3, in the first conventional example, it is known that by heat treatment, the nickel film and the n-type SiC semiconductor portion react, forming the nickel silicide that becomes the film surface electrode film, and the excess carbon atoms occurring from this reaction are deposited in a large volume in the uppermost surface of the surface electrode film.

The carbon layer deposited in the uppermost surface of the surface electrode film has poor adhesion with wiring film made of aluminum. When a wiring film of aluminum is deposited after a carbon layer has been deposited on the upper most surface of the surface electrode film, the wiring film is prone to peeling. To enhance adhesion to the wiring film, the carbon atoms in the n-type SiC semiconductor portion are not allowed to diffuse to the uppermost surface of the surface electrode film or the excess carbon atoms occurring consequent to the reaction of the surface electrode film and the n-type SiC semiconductor portion have to be removed. Thus, in the present disclosure, the surface electrode film 4 is configured by sequentially stacking the first electrode film 2 (Ni film) and the second electrode film 3 (NiSiTa film) such that diffusion of the carbon atoms to the uppermost surface of the surface electrode film 4 is suppressed. Preferred conditions of the first and second electrode films 2, 3 were verified.

First, verification concerning the thickness of the first electrode film 2 was performed. Multiple test specimens differing in thickness of the first electrode film 2 were produced according to the described manufacturing method of a silicon carbide semiconductor apparatus according to the embodiment (hereinafter, first example). Each test specimen of the first example was subjected to heat treatment under the conditions given as an example above. Further, in each test specimen of the first example, the thickness and the composition of the second electrode film 3 were respectively 90 nm and 60Ni30Si10Ta. With respect to each test specimen of the first example, element distribution in a depth direction from the uppermost surface of the surface electrode film 4 was measured by an XPS method. The results are depicted in FIG. 4. In FIG. 4, the inclusion rate (Si composition) of silicon atoms near the uppermost surface of the surface electrode film 4 and the inclusion rate (Ni composition) of nickel atoms, and the deposition volume (C composition) of carbon atoms on the uppermost surface of the surface electrode film 4 are depicted (similarly in FIG. 5).

From the results depicted in FIG. 4, when the thickness of the first electrode film 2 exceeds 10 nm, the thicker the first electrode film 2 is, the greater the deposition volume of carbon atoms on the uppermost surface of the surface electrode film 4 is. The reason for this is that the reaction amount of the nickel atoms in the first electrode film 2 and the silicon atoms in the n-type SiC semiconductor portion 1 becomes great as does the excess carbon atoms that separate from the n-type SiC semiconductor portion 1. Therefore, although the thickness of the first electrode film 2 is preferably thin, as described above, when the thickness of the first electrode film 2 is too thin (for example, less than 3 nm), the reaction of the nickel atoms in the first electrode film 2 and the silicon atoms in the n-type SiC semiconductor portion 1 is insufficient, whereby the ohmic property is negatively affected. Therefore, the thickness of the first electrode film 2 is preferably about 3 nm or more and 10 nm or less enabling formation of a favorable ohmic contact with the n-type SiC semiconductor portion 1 (region encompassed by bold-lined box).

Verification concerning the composition of the second electrode film 3 was performed. Multiple test specimens differing in tantalum atom inclusion rate in the second electrode film 3 were produced according to the described manufacturing method of a silicon carbide semiconductor apparatus according to the embodiment (hereinafter, second example). In each test specimen of the second example, the composition (NiSiTa film composition) of the second electrode film 3 is set such that the inclusion rate of nickel atom becomes twice the inclusion rate of the silicon atoms (Ni: Si=2:1). Further, the thickness of the first electrode film 2 and the thickness of the second electrode film 3 were respectively 10 nm and 90 nm. The heat treatment conditions of the test specimens of the second example were identical to those in the first example. For each of the test specimens of the second example, element distribution in a depth direction from the uppermost surface of the surface electrode film 4 was measured by an XPS method. Results are depicted in FIGS. 5 and 6. In FIG. 6, among the test specimens of the second example, the test specimen in a case where the composition of the second electrode film 3 was 60Ni30Si10Ta is depicted.

As depicted in FIG. 5, in the second example, it was confirmed that when the inclusion rate of the tantalum atoms in the second electrode film 3 is low, less than 10 at %, the effect of suppressing deposition of carbon atoms on the uppermost surface of the surface electrode film 4 is minimal. On the other hand, it was confirmed that by setting the inclusion rate of the tantalum atoms in the second electrode film 3 to 10 at % or more, the effect of suppressing the deposition of carbon atoms on the uppermost surface of the surface electrode film 4 is high. From the results depicted in FIG. 6 as well, the inclusion rate of carbon atoms decreases from a vicinity of the boundary of the n-type SiC semiconductor portion 1 (SiC layer) and the surface electrode film 4 ($Ni_2Si$+TaC layer), toward the uppermost surface of the surface electrode film 4 (position where sputtering time=0 minutes). Although not depicted, it was confirmed by the inventor that when the inclusion rate of the tantalum atoms in the second electrode film 3 exceeds 20 at %, non-bonded tantalum atoms tend to remain in the second electrode film 3, negatively affecting the ohmic property. Therefore, the inclusion rate of tantalum atoms in the second electrode film 3 is preferably about 10 at % or greater and 20 at % or less (region encompassed by bold-lined box).

From the verification results, it was confirmed that by setting the thickness of the first electrode film 2 to be 3 nm or greater and 10 nm or less and setting the composition of the second electrode film 3 to be within a range from 60Ni30Si10Ta to 53Ni27Si20Ta, the deposition of carbon atoms in the uppermost surface of the surface electrode film 4 can be reduced. A third example satisfying these conditions was produced and verification concerning adhesion of the surface electrode film 4 and the wiring film was performed. The third example is a test specimen where in a surface of a 20 mm square SiC substrate (semiconductor chip), the surface electrode film 4 of the sequentially stacked first and second electrode films 2, 3 is formed and subjected to heat treatment. The thickness of the first electrode film 2 was 10 nm and, the thickness and the composition of the second electrode film 3 were 90 nm and 60Ni30Si10Ta, respectively. The manufacturing method of the third example was identical to that of the first example. For comparison, a test specimen where a nickel film (surface electrode film) of a thickness of 90 nm was deposited and subjected to heat treatment was produced (hereinafter, second conventional example). The conditions of the manufacturing method of the second conventional example were the same as those of the first conventional example with the exception of the thickness of the nickel film. With respect to the third example and the second conventional example, an aluminum wiring film of a thickness of 5 µm was formed in the uppermost surface of the surface electrode film and by tearing off tape attached to the wiring film, whether the wiring film peeled was observed. The result confirms in the second conventional example, peeling of the wire film of an area that is one half or more of the area in contact with the surface electrode film. On the other hand, in the third example, it was confirmed that no peeling of the wiring film occurred.

In the description above, the present disclosure is not limited to the embodiments described and various modifications within a scope not deviating from the spirit of the invention are possible. The present disclosure is further applicable in cases where the conductivity types (n-type, p-type) are reversed.

According to the disclosure, excess carbon atoms that separate from the SiC semiconductor portion consequent to reaction with the first electrode film during heat treatment can be bonded with tantalum atoms in the second electrode film. As a result, the excess carbon atoms that separate from the SiC semiconductor portion can be taken into the surface electrode film, enabling the deposition of the carbon atoms on the uppermost surface of the surface electrode film to be suppressed. Consequently, adhesion of the surface electrode film and the wiring film formed in the uppermost surface of the surface electrode film can be increased, inhibiting peeling of the wiring film. Further, since a metal film that includes nickel silicide can be formed as the surface electrode film, adhesion to the SiC semiconductor portion is strong and the contact resistance is low.

According to the manufacturing method of a silicon carbide semiconductor apparatus of the present disclosure, an effect can be achieved in that even when high temperature heat treatment is performed, the adhesion of the electrode film forming the ohmic contact with the SiC semiconductor portion and the wiring film stacked on this electrode film can be secured.

As described, the manufacturing method of a silicon carbide semiconductor apparatus of the present disclosure is useful in silicon carbide semiconductor apparatuses used in various types of industrial machines, automobiles, etc., and is particularly suitable for silicon carbide semiconductor apparatuses having a surface electrode film forming an ohmic contact of a SiC semiconductor portion.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a silicon carbide semiconductor apparatus and forming an ohmic contact of a silicon carbide semiconductor portion including silicon atoms and carbon atoms and a surface electrode film formed in a surface of the silicon carbide semiconductor portion, the manufacturing method comprising:

forming, in a surface of the silicon carbide semiconductor portion, a first electrode film comprised of nickel as the surface electrode film;

forming, in a surface of the first electrode film, a second electrode film comprised of nickel, silicon, and tantalum as the surface electrode film; and forming an ohmic contact of the silicon carbide semiconductor portion and the surface electrode film by:

reacting silicon atoms of the silicon carbide semiconductor portion and nickel atoms of the first electrode film; and heat treating to cause silicidation of the first electrode film to form nickel silicide.

2. The method according to claim 1, wherein, during forming the ohmic contact, carbon atoms separate from the silicon carbide semiconductor portion, and wherein forming the second electrode film includes forming the second electrode film to include tantalum atoms of an atom count that is close to an atom count of the carbon atoms that separate from the silicon carbide semiconductor portion during forming the ohmic contact.

3. The method according to claim 1, wherein forming the second electrode film includes including tantalum atoms at an inclusion rate of 10 at % or more and 20 at % or less.

4. The method according to claim 1, wherein forming the second electrode film includes including nickel atoms and silicon atoms of a compositional ratio that is close to a compositional ratio of nickel silicide generated by heat treating to cause silicidation of the silicon carbide semiconductor portion and the nickel of the first electrode film.

5. The method according to claim 4, wherein forming the second electrode film includes including nickel atoms at an inclusion rate that is twice that of the silicon atoms.

6. The method according to claim 1, wherein forming the second electrode film includes providing a composition within a range of from an inclusion rate of 60 at % nickel atoms, 30 at % silicon atoms, and 10 at % tantalum atoms to an inclusion rate of 53 at % nickel atoms, 27 at % silicon atoms, and 20 at % tantalum atoms.

7. The method according to claim 1, wherein forming the first electrode film includes forming the first electrode film to have a thickness of 3 nm or more and 10 nm or less.

\* \* \* \* \*